(12) United States Patent
Atanackovic

(10) Patent No.: US 6,597,011 B1
(45) Date of Patent: *Jul. 22, 2003

(54) DUAL NON-PARALLEL ELECTRONIC FIELD ELECTRO-OPTIC EFFECT DEVICE

(75) Inventor: Petar Branko Atanackovic, Ascot Park (AU)

(73) Assignee: Defence Science and Technology Organization, Salisbury (AU)

( * ) Notice: Subject to any disclaimer, the term of this patent is extended or adjusted under 35 U.S.C. 154(b) by 75 days.

This patent is subject to a terminal disclaimer.

(21) Appl. No.: 09/606,611

(22) Filed: Jun. 29, 2000

Related U.S. Application Data

(63) Continuation of application No. 09/236,261, filed on Jan. 22, 1999, now abandoned.

(30) Foreign Application Priority Data

Jan. 23, 1998 (AU) .............................................. PP1473

(51) Int. Cl.[7] .............................................. H01L 29/06
(52) U.S. Cl. .............................. 257/20; 257/12; 257/13; 257/14; 257/15; 257/17; 257/23; 257/24; 257/432; 438/20; 438/28; 438/48; 438/590
(58) Field of Search .............................. 257/12, 13, 14, 257/15, 17, 18, 20, 23, 24, 432; 438/20, 22, 48, 590

(56) References Cited

U.S. PATENT DOCUMENTS

| | | | | |
|---|---|---|---|---|
| 5,326,995 A | * | 7/1994 | Ohori .......................... | 257/194 |
| 5,367,177 A | | 11/1994 | Taylor et al. .................. | 257/20 |
| 5,412,224 A | | 5/1995 | Goronkin et al. .............. | 257/15 |
| 5,412,232 A | | 5/1995 | Ando .......................... | 257/194 |
| 5,442,205 A | * | 8/1995 | Brasen et al. ................ | 257/191 |

(List continued on next page.)

FOREIGN PATENT DOCUMENTS

| | | | | |
|---|---|---|---|---|
| JP | 402148741 | 6/1990 | .................. | 257/20 |
| JP | 402178936 | 8/1991 | .................. | 257/20 |
| JP | 403196573 | 8/1991 | .................. | 257/20 |

OTHER PUBLICATIONS

Goossen et al, "Single–Layer Structure Supporting Both Heterojunction Bipolar Transistor and Surface–Normal Modulator", IEEE Photonics Technology Letters, vol. 4, No. 4, Apr. 1992, pp. 393–395.

Chemla et al, "Modulation of Absorption in Field–Effect Quantum Well Structures", IEEE Journal of Quantum Electronics, Vol 24, No. 8, Aug. 1988, pp. 1664–1675.

Sargood et al, "A Quantum–Well Inversion Channel Heterostructure as a Multifunctional Component for Optoelectronic Integrated Circuits", IEEE Journal of Quantum Electronics, vol. 29, No. 1, Jan. 1993, pp. 136–149.

Miller, David A.B., "Novel Analog Self–Electrooptic–Effect Devices", IEEE Journal of Quantum Electronics, vol. 29, No. 2, Feb., 1993, pp. 678–698.

(List continued on next page.)

Primary Examiner—Eddie Lee
Assistant Examiner—Edgardo Ortiz
(74) Attorney, Agent, or Firm—Sand & Sebolt

(57) ABSTRACT

An improved optical modulator and photodetector suitable for high frequency operation and compatible with monolithic microwave integrated circuit technology. Typical implementations use a reversed biased diode containing not intentionally doped (NID) optically active region sandwiched between conductive layers of p-doped and n-doped semiconductor layers, respectively. With monochromatic optical radiation incident upon the device a photocurrent (comprising of an electron-hole pair created for each photon absorbed) can be generated using the optical nonlinearity of the multiple quantum well structure inside the active region. This photocurrent can be used in an external circuit to provide photocurrent feedback to the device itself.

13 Claims, 12 Drawing Sheets

U.S. PATENT DOCUMENTS

| | | | | |
|---|---|---|---|---|
| 5,661,740 | A | | 8/1997 | Dutta et al. .................... 372/45 |
| 5,705,827 | A | | 1/1998 | Baba et al. .................... 257/46 |
| 5,825,049 | A | | 10/1998 | Simmons et al. ............. 257/25 |
| 5,841,151 | A | | 11/1998 | Sahara ......................... 257/14 |
| 5,929,462 | A | * | 7/1999 | Kasukawa et al. ............ 257/18 |
| 5,959,317 | A | | 9/1999 | Niwa .......................... 257/194 |
| 6,031,256 | A | * | 2/2000 | Liu et al. .................... 257/198 |
| 6,057,559 | A | * | 5/2000 | Cheng et al. ................. 257/94 |
| 6,426,514 | B1 | * | 7/2002 | Atanackovic ................ 257/14 |

OTHER PUBLICATIONS

Wegener et al, "Electroabsorption and refraction by electron transfer in asymmetric modulation–doped multiple quantum well structures", Applied Physics, Lett. 55 (6), Aug. 7, 1989, pp. 583–585.

Chemla et al, "Nonlinear Optical Properties of Multiple Quantum Well Structures for Optical Signal Processing", Semiconductors and SemiMetals, Vol 24, 1987, pp. 279–318.

K.W. Goossen, J.E. Cunningham, and W.Y. Jan Single–Layer Structure Supporting Both Heterojunction Bipolar Transistor and Surface–Normal Modulator IEEE Photonicks Technology Letters, vol. 4, No. 4 Apr.

D.S. Chemla, I. Bar–Joseph, J.M. Kuo, T.Y. Chang, C. Klingshirn, Gabriela Livescu, David A.B. Miller "Modulation of Absorption in Field–Effect Quantum Well Structures" IEEE Journal of Quantum Electronis, vol. 24, No. 8, Aug. 1988.

David A.B. Miller "Novel Analog Self–Electrooptic–Effect Devices" IEEE Journal of Quantum Electronics, vol. 29, No. 2, Feb. 1993.

M. Wegener, T.Y.Chang, I.Bar–Joseph, J.M/Kuo, D.S. Chemia "Electroabsorption and fefraction by electron transfer in asymmetric modulation–doped multiple quantum well structures" 1989 American Institued of Physics.

Stephen K. Sargood, Geoffrey W. Taylor, Paul R. Claisse, Timothy Vang, Paul Cooke, Daniel P. Docter, Philip A. Kiely, Charles A. Burrus, Jr. "A Quantum–Well Inversion Channel Heterostructure as a Multifunctional Component for optoelectronic Integrated Circuits" IEEE Journal of Quantum Electronis, vol. 29, No. 1, Jan. 1993.

D.S. Chemla, D.A.B. Miller, P.W. Smith "Nonlinear Optical Properties of Multiple Quantum Well Structures for Optical Signal Processing" Bell Telephone Laboratories 1987.

* cited by examiner

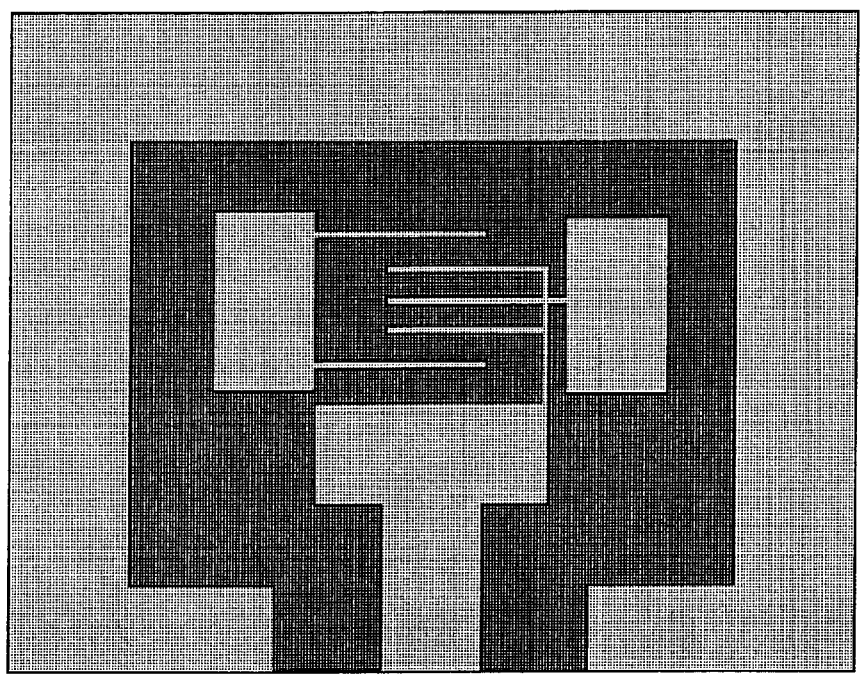
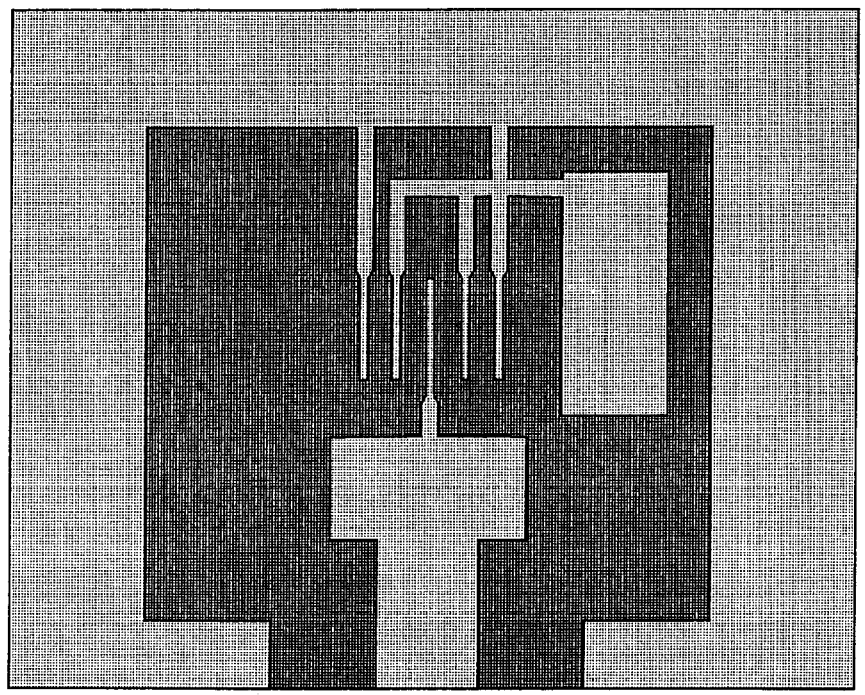
FIG 7

DUAL NON-PARALLEL ELECTRONIC FIELD ELECTRO-OPTIC EFFECT DEVICE

This application is a continuation in part of application Ser. No. 09/236,261, filed on Jan. 22, 1999, now abandoned.

The present invention relates to an electro-optical or single carrier electronic device that utilises the simultaneous application of two non-parallel electric fields.

BACKGROUND OF THE INVENTION

Optoelectronic devices are well known. They use a means responsive to light to generate a photocurrent, a structure that has a semiconductor quantum well region and a means that responds to the photocurrent so as to electrically control the optical absorption of the semiconductor quantum well region. The optical absorption of a semiconductor quantum well region can vary in response to variations in applied electric field.

The absorption is excitonic in nature and arises from the quantization of discrete energy levels in the conduction band and valence band potential energy wells formed by sandwiching a narrow band gap (NBG) semiconductor between two wide band gap (WBG) semiconductors. If the thickness of the well layer is much smaller than the De Broglie wavelength of the electron, quantum size effects occur. If the minimum of the conduction band edge and valence band maximum of both potential wells occur in the NBG layer, quantized energy levels separated by the NBG energy manifest themselves in the optical absorption spectrum as discrete absorption features separated from the bulk absorption edge. These absorption features are due to the instantaneous creation of electron-hole pairs which experience enhanced coulomb attraction due to their spatial confinement in the potential well, thereby increasing the electron-hole binding energy. As a result, the electron-hole pair, or exciton, is stable against phonon collisions and is stable at room temperature. Modulation of the energy at which this exciton absorption is maximum can be accomplished using the Quantum Confined Stark Effect (QCSE) by a suitably orientated applied electric field, as described by Chemla, D. S. in U.S. Pat. No. 4,525,687.

Conventional optical modulation and photodetection devices employ schemes that use, in general, a reverse biased diode structure containing a not intentionally doped (NID) optically active region sandwiched between conductive layers of p-doped and n-doped semiconductor layers so as to form a p-i-n diode. The electric field being generated across the NID active region by application of a voltage source to the p-doped and n-doped contacts with polarity so as to reverse bias the p-i-n diode. This arrangement has the advantage of producing a low dark current.

When the device is illuminated with suitable wavelength light so as to coincide with the absorption properties of the NID active region, each photon absorbed in the active region instantaneously creates an electron-hole pair (to within ~50 femtoseconds). For optical radiation coupled to the active region with direction of propagation mostly perpendicular to the semiconductor layers, the p-doped and n-doped layers are composed of wider band gap material so as to render them transparent to the radiation.

Due to the applied electric field the photogenerated carriers (electrons and holes) are separated and swept to opposite sides of the device, electrons toward the n-doped contact and holes toward the p-doped contact, thereby generating a photocurrent in an external circuit. This photocurrent is superimposed on the dark current.

For function as a tunable photodetector the device described is an electrical two-port and optical one-port device. For function as an optical beam processing device with a modulated output optical beam constitutes an electrical two-port and optical two-port device.

The photocurrent generated using the optical non-linearity of the multiple quantum structure inside the active region can be used in an external circuit to provide voltage feedback to the device itself. This is commonly referred to as the Self Electro-optic Effect Device (SEED) as described by Miller, D. A. B. in U.S. Pat. No. 4,546,244. The SEED uses the electric field dependence of the exciton absorption (due to electric field modification of the quantum well potential energy) in the active layer by the use of QCSE, and the photocurrent generated can be used to provide positive or negative feedback to the device. This allows one to construct circuits which exhibit optical switching (positive feedback) and optical self linearization/modulation (negative feedback) characteristics.

Note that when the device is used with photocurrent feedback, the photocurrent cannot be amplified electrically without influencing the voltage across the device. A limitation in such a configuration is that the size of the photocurrent ( ) available for use in the external circuit is limited by exciton saturation (which saturates the absorption and broadens the optical non-linearity) and thereby places a maximum value to the input optical power ($_i$). It can be shown that the characteristic response time ( ) of p-i-n SEED can be written as (see Miller, D. A. B., "Novel Analog Self-Electrooptic Effect Devices", IEEE J. Quant. Electron., Vol. 29, No. 2, p. 678), $$\tau_r = k \left( \frac{C}{G_i} \right),$$

where C is the capacitance, G=dA/dV is the modulator sensitivity defined as the derivative with respect to voltage, A is the voltage dependent absorption of the active region, and k is a constant determined by the incident photon energy. The above equation illustrates that smaller capacitance, larger input optical power and larger absorption sensitivity can be used to decrease the response time. Therefore, it is argued for a given C, G and k, the maximum incident power determines the maximum photocurrent that can be generated and thus speed of the device. Methods to amplify the photocurrent generated in the MQW active region can be via the use of transistor action. Miller in U.S. Pat. No. 4,546,244 teaches an integrated phototransistor/SEED device formed as a (p-type emitter/n-type-base/p-type collector) followed by a p-i(MQW)-n. As an optically controlled modulator this device is an electrical two-port and optical three-port device where current amplification (controlled by an optical beam impinging upon the base region of the pnp transistor) is physically separate to the p-i(MQW)-n diode which must remain in reverse bias for absorption modulation.

Another method developed by Goossen et. al. IEEE J. Photonics Tech. Lett., Vol. 4, No. 4, p. 393, teach a device where a NID MQW is placed between the base-collector region of a heterojunction phototransistor (HPT) to form, for example, an (n-type emitter/p-type-base/NID MQW/n-type collector) structure. Both these structures rely upon carrier flow along the growth direction and therefore suffer from low mobility due to the MQW barriers. To increase the carrier mobility toward that found in bulk material, the MQW confining barriers were reduced to form extremely shallow quantum wells. Exciton features are still present but speed of operation is at the expense of carrier confinement and thus exciton absorption strength. The present invention seeks to improve on known devices by physically separating the photocurrent transport from the perpendicular biased electric fields so as to produce an electrical four-port and optical two-port device, by the simultaneous application of non-parallel fields. As will be discussed later, the configuration of the present invention allows one to optimize the capacitance of the device without affecting the lateral response time. Two important consequences of this proposed configuration are:

(i) the thickness of the intrinsic region along the growth direction, (i.e. number of quantum wells and superlattice blocking layers), can be increased thereby reducing the capacitance seen by the QCSE modulating field; and (ii) the lateral transit time of the photogenerated electrons and holes, which is determined by the source-drain separation and in-plane mobility, can be optimized for high speed operation.

In an optimum configuration one applies both perpendicular and parallel electric fields (that may be intrinsically or externally applied) to a material containing two-dimensional quantum wells (or superlattice) one dimensional quantum wires or zero dimensional quantum dots (comprising the active region of the device).

The device predominately consists of layered dissimilar energy bandgap semiconductor materials that comprise of combinations of bulk material and ultrathin layers utilizing the quantum size effect. The device is structured so as to contain an optically active region such that the optical and/or electrical response can be altered by the application of externally applied electric fields. Depending upon the type of active region, there exists spatial directions mostly perpendicular and parallel to the semiconductor layers which can be used to:

(i) apply an electric field mostly parallel to the plane of the active region (perpendicular to the quantum well growth direction) so as to either extract photogenerated current carriers from or inject current carriers within the plane of the active region only; and (ii) apply an electric field mostly perpendicular to the plane of the active region (parallel to the quantum well growth direction) so as to produce absorption modulation via the QCSE within the active region such that the photogenerated current is electrically isolated internal to the device from the electrical contacts which generate the QCSE field.

The advantage of the present invention is that photogenerated current carriers can be extracted solely from the plane of the active region independently and simultaneously to the electric field responsible for absorption modulation of the active region. The extracted electrons and holes can be used to generate a current in an external circuit. This extracted photocurrent ($I_{phot}$) can then be amplified by a factor N and consequently used as the feedback current to the device ($I_f = N \times I_{phot}$) Conversely, the photocurrent can be kept electrically isolated from the absorption modulating field such that no feedback occurs. It is noted by the inventor that photocurrent amplification in an electrical two-port and optical two port device could be achieved if the active region of the device also had the capability of avalanche multiplication. That is, the introduction of a multiplication region following the absorber section optimized for the multiplication of either electron or hole. A method for accomplishing this is explained latter in this section.

The present invention claims a device which is not obvious to a person skilled in the art and is capable of performing new functions. By suitable design of the present invention, the photogenerated electrons and holes can be spatially controlled in the lateral direction. Examples of novel modes of operation can be described as follows. By controlling the extraction of electrons and holes from the plane of the active region, by controlling the parallel electric field, one can perform a switching function. Consider the effect of 'trapping' photogenerated holes and electrons in the active region by reducing the parallel field close to zero. An exciton will ionize into an electron-hole plasma by collision with a longitudinal optical phonon and be separated by the perpendicular field. The vertical transport of the carriers through the structure toward the conducting regions responsible for the perpendicular field is inhibited by regions acting effectively as wide band gap energy semiconductors which sandwich either side of the active region. Thus electrons and holes pile-up at their respective potential energy barriers defined by the interface between the wide band gap 'blocking layers' and active region. This phenomenon tends to screen the applied electric field and thus modulate the absorption of the active region via the reverse QCSE. The device can be reset by the application of the parallel field which will sweep-out the photogenerated carriers laterally.

Alternatively, by efficiently sweeping out the photogenerated charge in the plane of the active region, pile-up of photogenerated charge is avoided. Therefore, the operating point of the principle exciton absorption peak will not be altered by the reverse QCSE as is usually seen in high optical power operation of electrical two-port and optical two port p-i-n modulators.

This new function, has advantages in the design of mixed electronic-optical circuits such that signal processing can be performed in both the electronic and optical domains.

To a person familiar with the art, it is well known that an electric field mostly parallel to the plane of the layers comprising the active region of a multiple quantum well structure can be used to modulate the excitonic and band-edge absorption through the Franz-Keldysh Effect (FZE) as described by Chemla, D. S. et. al., "Non-linear Optical Properties of Multiple Quantum Well Structures for Optical Signal Processing", Chapter 5, Semiconductors and Semimetals, Vol. 24. This effect is however much smaller than the use of QCSE when an electric field is directed mostly perpendicular to the plane of the quantum well. In the present invention we make use of this fact and keep the in-plane electric field smaller than the electric field responsible for the QCSE, as demonstrated later.

It is also known that the growth of a strained layer superlattice or multiple quantum well consisting of alternate narrow band gap (NBG) well layers of unstrained lattice constant $a\_w$ and wide band gap (WBG) barrier layers of lattice constant $a\_b$, can be grown epitaxially to form a sequence of elastically deformed layers grown as WBG-NBG-WBG-NBG . . . -WBG coherently strained to a substrate or buffer layer with lattice constant $a\_sub$, such that $a\_b < a\_sub < a\_w$. The thickness of each layer not exceeding the critical layer thickness of the NBG and WBG material. For coherent superlattice growth (i.e. no defects at the heterojunction interfaces) the in-plane lattice constant of superlattice layers is constrained to that of the substrate acting as a rigid material. In the case of cubic semiconductors, for example $In\_(x)Ga\_(1-x)As$, the well and barrier layers, as described above, experience in-plane compression and tension, respectively. This tetragonal distortion of the well and barrier crystal structure alters the electronic and optical properties of the individual layers. The strain can be used to enhance the effective mass of holes but is accessible electrically only to in-plane motion. That is, enhanced mobility of the holes can be obtained for motion in the plane of the superlattice.

For optically active regions relying on absorption controlled by the transition energy between quantized energy levels of a Type-I quantum well (i.e. electrons and holes confined in the same physical layer) with the conduction band minimum and valence band maximum at the Brillouin zone center (or for a short period superlattice at the mini-Brillouin boundary) one has the instantaneous creation of electron and hole for each photon absorbed. Characteristic to semiconductors, the electron effective mass is typically an order of magnitude smaller than the heavy-hole. The strongest exciton absorption feature in quantum well structures is also typically due to the lowest energy electron and heavy-hole transition. The electrical response of devices utilizing this effect is therefore limited to the slower moving carrier, namely the heavy-hole. The present invention seeks to take advantage of this fact by being able to enhance the in-plane heavy-hole effective mass ($_h$) by the use of coherently strained layers to warp the valence band of the superlattice or quantum well. The effective mass can be defined as the curvature of the heavy-hole dispersion (heavy-hole energy $E_{hh}$ ( ) versus in-plane wave-vector):

$$m^*_{hh}(k_\square) \propto \left( \frac{\partial^2 E_{hh}(k_\square)}{\partial k_\square^2} \right).$$

That is, the hole effective mass is defined as the inverse of the second derivative of the hole energy $E_{hh}$ ( ) with respect to the in-plane momentum. By suitable design of the strain one can reduce the heavy-hole effective mass for a range of in-plane wave-vectors mostly parallel to the layers of the superlattice or multiple quantum well (see FIG. 12).

It is also noted by the inventor that a new class of active region can be constructed by the use of zone-folding techniques applied to strained superlattices consisting of semiconductors A and B which exhibit a Type-II (electrons and holes confined separately in layers A and B) heterojunction offset. By appropriately strain tuning the superlattice it is proposed the present invention make use of this fact for the implementation of a new class of electro-optic devices. By choosing a material system such that the light-holes are confined in separate layer (layer B) to that of the electron (layer A) and straining layer B so as to be in a state of tension and layer A in compression one can produce an energy regime where the light-hole is the lowest energy excitation. Further by constructing the short period superlattice with appropriate period one can use zone-folding effects to form a pseudo indirect band gap material which is optimized for impact ionization of an electron or hole. The structure described above is possible for example using type-II InP/GaAs or mixed type-I/II CdZnTe/CdTe heterojunction material systems. The lowest energy hole dispersion is now characterized by having an energy maximum located not at k=0 but at an in-plane wave-vector k' not equal to zero. It is proposed this concept can be used to include efficient avalanche multiplication within the active region.

A prominent advantage of the present invention is that it overcomes the conflicting design parameters of typical electrical two-port devices where strong exciton resonances are desirable and high speed operation is required. Strong exciton resonances are due to the confinement of the photogenerated electron-hole pair (i.e. exciton) in the quantum well by large energy band gap material (deep quantum wells). Vertical transport of the ionized carriers to the their respective contacts is therefore via tunneling through or thermionic conduction of the electrons and holes over large carrier confining potential energy barriers. If tunneling is optimized, the photogenerated carriers are delocalized along the growth direction and thus the exciton strength degrades. Typically the heavy-hole is less mobile through the structure and results in a upper speed limit for pulsed operation. Therefore a trade-off is usually sought between speed and absorption contrast ratio. The present invention can optimize photocarrier extraction speed and exciton strength.

It may now be instructive to discuss prior art for the purpose of establishing differences in principle and functionality of the present invention. Tunable photodetectors which also use dual electric fields mostly perpendicular to each other disposed across the inversion layer in the conduction band of a single quantum well formed by modulation doping a heterostructure are described by Taylor et. al. In U.S. Pat. No. 5,3,67,177 and Chemla et. al. IEEE J. Quant. Electron., Vol. 24, No. 8, p. 1664. Taylor et. al. teaches a device which can be generally classified in the present context as an electrical three-port and optical two-port device and relies on the wavelength selectivity by a periodic perturbation along the length of a waveguide structure. This device does not primarily tune its wavelength selectivity electrically but is an interferometric device determined by the grating period of the cavity. Those frequencies which are not resonant with the physical grating (defined by ion-implantation) are not absorbed. This grating should not be confused with the implementation of the folded multi-electrode structure of the present invention disclosed in FIGS. 6, 7 and 8.

Sargood et. al. IEEE J. Quant. Electron., Vol. 29, No. 1, p. 136, also demonstrate a version of the Taylor device as a waveguide modulator using the phase space absorption quenching (PAQ) properties of the modulation-doped single quantum well active region similar in principle to that of Chemla et. al IEEE J. Quant. Electron., Vol. 24, No. 8, p. 1664. This device, however, makes no attempt to design the epitaxial structure for the explicit purpose of electrically isolating both photogenerated electrons and holes from the gate and collector or design the device for the explicit purpose of extracting photogenenerated electrons and holes solely within the plane of the quantum well. The Taylor device structure functions as a photodetector by extracting the photogenerated electrons laterally and photogenerated holes vertically via the collector. Note that the source and drain terminals are indistinguishable. The gate is used to control the electron concentration in the inversion layer of the modulation-doped quantum well similar to a field effect transistor and thus control the absorption of the active region via band filling effects ( also known as a barrier reservoir and quantum-well electron-transfer (BRAQWET) structure described by Wegener et. al. Appl. Phys. Lett., Vol.55, No. 6, p.583. ). The PAQ modulation mechanism is fundamentally different to QCSE in that the quasi-Fermi energy level in the conduction band is controlled relative to the first quantized electron energy level of the quantum well. The gate is thus used to transfer electrons to and from an electron reservoir provided by the modulation-doped wide band gap layer separated from the single quantum well by a thin spacer layer. Thus instead of modulating the excitonic absorption by the QCSE (i.e. exciton energy redshift with increasing electric field), one fills the available quantized electrons states such that the band edge absorption of the single quantum well is reduced by the PAQ mechanism. This is similar in principle to the Burstien-Moss shift seen in degenerately-doped semiconductors.

Referring to the Taylor device (in particular the HFEM and HFED devices disclosed in Sargood et. al. IEEE Quant.

Elect., Vol. 29, No. 1, p.136), and from the above discussion it is expected the source-drain circuit as a function of gate voltage not to exhibit negative differential resistance (NDR). In contrast it is demonstrated that the present invention does indeed produce in NDR in the drain-source circuit due to QCSEof a NID MQW. Further, the Taylor devices require both n-doped and p-doped epitaxial material to define the inversion channel and zero bias potential energy as a function of growth direction.

Hirayama et. al. U.S. Pat. No. 5,608,230 describes a strained superlattice semiconductor photodetector having a side contact structure. In the present context this device is classed as an electrical two-port and optical one-port device. Hirayama also teaches the known benefits of strained layer superlattices to enhance the heavy-hole effective mass, thereby minimizing hole space-charge effects. The in-plane effective mass of the valence band is modified by the use of strained layer superlattice and thus takes advantage of the modified hole mobility by extracting the photogenerated hole in the plane of the superlattice. This device does not tune the absorption of the superlattice by the use of an electrically independent field. The use of strained layer material in excess of ±1 lattice mismatch can however be used to further improve the valence band mobility enhancement when used in conjunction with short period superlattices such that zone-folding effects can be used.

The present invention is therefore distinguished from these devices by having the following characteristics:

(i) photogenerated electrons and holes are designed to be extracted solely within the plane of the quantum well layers; and (ii) exciton absorption modulation of the active region is via the QCSE generated by an electrically isolated field mostly perpendicular to that of the extraction field; and (iii) the epitaxial device structure uses a single dopant species and intrinsic material for the epitaxial growth in conjunction with superlattice blocking layers to manage the dark current vertically through the device; and (iv) photogenerated electrons and holes are extracted from within the plane of the layer of a strained multiple quantum well so as to enhance the in-plane hole and electron mobility for a range of wave-vectors mostly in the plane of the layers; and (v) the device is symmetric with respect to vertical top and bottom contacts and thus has an odd symmetric negative differential resistance characteristic in the drain-source photocurrent versus QCSE field (generated via the top-bottom voltage) when illuminated with monochromatic light of suitable energy.

SUMMARY OF THE INVENTION

The present invention is for devices that can have optical propagation in the plane of the epitaxial layers of the device so as to form a waveguide device or a multiple interdigitated electrode implementations for coupling optical radiation mostly perpendicular to the plane of the layers of the device.

Using quantum well material, the modulation of the exciton absorption is accomplished by an electric field parallel to the growth direction (perpendicular to the plane of the semiconductor heterojunction layers). This electric field is generated by two n-doped layers sandwiching the multiple quantum well active region. Electrical contacts are via ohmic metallization to the n-doped layer. Vertical carrier transportation (i.e. carrier direction perpendicular to the plane of the layers) via tunneling, drift or diffusion are inhibited from reaching the conducting contacts sandwiching the active region (responsible for producing the electric field mostly parallel to the growth direction) by potential energy blocking layers. The 'blocking-layer' structure used to accomplish this is through the use of wide band gap energy semiconductor layers or multiquantum barrier superlattice to provide a large potential barrier for the transport of both electron and hole current carriers across the blocking layer-active layer interfaces. The use of multiquantum barrier superlattices can be used to generate a potential energy barrier in excess of that possible by a thick wide band gap potential barrier. For example, AlAs allows intervalley tunneling from the –valley to X–valley and therefore does not function as a wide band gap potential barrier in excess of the indirect gap. By suitable design of blocking layers one can control the dark current of the device. The dark current$_{dar}$ through the n-i-n structure will be controlled by the effective barrier height of the blocking layers relative to the conduction band edge of the degenerately doped n-type contact layers. That is, $$J_{dark} = \overline{k},$$

where q is the electron charge, k is Boltzmans constant and T is temperature. Therefore a large potential energy blocking layer is advantageous for reducing dark current and thus the signal-to-noise ratio in the proposed n-i(MQW)-n structure. It is well known that quantum mechanical reflection occurs if an electron with energy propagating toward a potential energy barrier of height $E_b$ and thickness d. This effect can be enhanced by constructing a superlattice analogous to a Bragg mirror such that carriers propagating toward such a structure with energy above that of the barrier material composing the superlattice will be coherently reflected. Taking into account the effective mass dispersion for electron and holes close to the –point ( i.e. k=0 symmetry point of the reciprocal lattice space) one can design a compound electron and hole reflector by using two short period superlattices grown successively, each optimized for either electron and hole. Alternately, one can design a chirped superlattice. The chirped superlattice is particularly attractive for making broad energy reflectors as the unit cell thickness comprising one well/barrier period can be fixed and the duty cycle of the barrier thickness varied in a linear series.

An added benefit is that large lattice mismatch bulk layers can be avoided for use as blocking layers while still performing dark current suppression.

A simultaneously parallel applied electric field, which can be used to extract/inject carriers into the active region is realized by electrically contacting the active region layers in a spatial direction parallel to plane of the quantum wells and the width between these contacts defining the optically active region.

The single dopant species (namely n-type) used in the present implementation is particularly useful for integration with high electron mobility transistors (HEMTs) so as to be compatible with monolithic microwave integrated circuit (MMIC) processing. P-type dopants are seldom used in MMIC processing as ohmic contacts to n-doped semiconductors are typically superior resulting in lower parasitics and very high frequency operation.

Using strained layer materials for the quantum well/barrier region one can deform the in-plane energy dispersion (hole energy versus in-plane wave vector relationship) of the valence band so as to dramatically reduce the in-plane effective mass of the lowest energy quantized hole subbands. FIG. 12 shows schematically the energy band structure as a function of momentum for Bulk semiconductor and Quantum Well material with the narrow bandgap energy layer experiencing in-plane compression. To those familiar with the art, one can see that the curvature of the valence band labeled 'hh1' representing the heavy-hole dispersion is increased for a range of in-plane wave-vectors compared to the bulk case. This phenomenon allows one to decrease the effective mass of the heavy-hole for a range of in-plane wave-vectors and thus increase its mobility perpendicular to the growth direction. This allows the device to be optimized for high speed applications requiring the fast extraction of photo-generated electrons AND holes from the active region. This concept is intrinsic to the development of the dual field QCSE device described herein. The invention can therefore be used as an electro-optic device suitable for the modulation of an optical signal (modulator) or detection of an optical signal (receiver). The unique feature is the separation of the photo-generated electrons and holes within the optically receptive region of the device from the diametrically opposed modulating field necessary for altering the absorption characteristics of the active region. That is, the extracted electrons and holes are electrically isolated (unless connected in an external circuit) from the electric field responsible for QSCE of the excitonic absorption.

Optical radiation that is incident upon the device is coupled into the active region using two different configurations. Firstly, one can use a wave-guide type geometry that has an optically guided wave mode mostly in the plane of the quantum well layers. The guided mode is at right angles to both the parallel and perpendicular fields. Second, using optical coupling mostly parallel to the growth direction, the optical wave has a propagation vector colinear with the perpendicular electric field and at right angles to the parallel field. The optically active material is aligned to the respective fields required for the desired extraction of photogenerated carrier and modulating field.

The present invention is preferably for an active region comprising of multiple quantum wells using AlGaAs and InGaAs semiconductors. The electric fields are established via a single n-type dopant species in an attempt to make the said device compatible with MMIC processing. Other implementations such as using p-type and n-type layers are also possible. It should be noted that heterostructures from other group III-V (e.g. InGaAsP, InAlGaAs, and InP), II-VI (e.g. CdZnTe), IV-IV (e.g. Si—Ge), amorphous silicon compounds and rare-earth-doped Silicon may equally be applied to this technology.

Therefore in one form of the invention though this need not be the only or indeed the broadest form there is proposed an optical device including:

means responsive to light for generating a photocurrent including;
a structure having a semiconductor quantum well region, and a means for the simultaneous application of non-parallel fields to the said quantum well structure such that photogenerated carriers (electrons AND holes) can be contained completely within the plane of the quantum well layers, thereby electrically isolating the field responsible for the absorption modulation.

In preference, the non-parallel electric fields are perpendicular to each other.

In preference, one electric field functions in the electronic transport for the extraction of electrons AND holes such that the electric field is directed with vector in the plane of the quantum well layers.

In preference, the other electric field is a perpendicular electric field with the vector parallel to the growth axis and is used for modulation of absorption of the quantum well structure using the quantum confined Stark effect.

In preference, a dark current perpendicular to the plane of the layers is controlled by potential energy barrier layers disposed at either side of the active region and further sandwiched between the said n-type layers.

The dark current blocking layers thus provide a high energy potential to the electrons and holes along the growth direction. The barrier may be either bulk or superlattice material to form a multiple quantum barrier. This allows a single dopant species to generate the modulating field and also produces an odd-symmetric modulating voltage behaviour about zero due to the inherent symmetry of the device structure.

In preference, the device includes strained layer quantum well material within the active region grown coherently strained to a substrate or buffer layer. By utilizing strained layer quantum well material for the active region the heavy-hole in-plane effective mass can be substantially reduced for a range of in-plane wave-vectors mostly parallel to the plane of the quantum well. The capability of extracting simultaneously the electrons AND holes in the plane of the quantum well therefore allows access to this enhanced hole mobility. This allows the device to operate at high speeds and not suffer from hole space charge effects.

By controlling the extraction of both photogenerated electrons and holes parallel to the quantum wells, the optical response of the device can be varied. That is, by reducing the extraction efficiency of photogenerated charge in the active region, electrons and holes will accumulate at opposite regions defined by the blocking-layer active-region interfaces. The space charge generated will reduce the electric field parallel to the growth direction and thereby provide a switching function via the reverse quantum confined Stark effect.

The single dopant structure may not need to contain a depletion region to function. The present n-i-n device therefore does not have a built in electric field across the active region and is symmetric in structure. The photocurrent extracted from within the plane of the quantum well versus the QCSE field applied perpendicular to the plane of the quantum well has a transfer characteristic which odd-symmetric about zero.

By injecting charge carriers of a single species by the application of a current source to the contacts contacting the plane of the quantum well layers, the absorption of the quantum well can be modified by phase-space/free-carrier absorption.

BRIEF DESCRIPTION OF THE DRAWINGS

To assist in understanding the invention reference is made to the following drawings in which:

FIG. 7 is a photograph top view showing the invention manufactured into two different configurations, being a modulator (upper) and receiver (lower). Optical coupling is along the growth direction;

right: diagram depicting the energy versus in-plane momentum of Quantum Well in compression. Lowest energy heavy-hole is labeled hh1(k=0).

Figure 8:
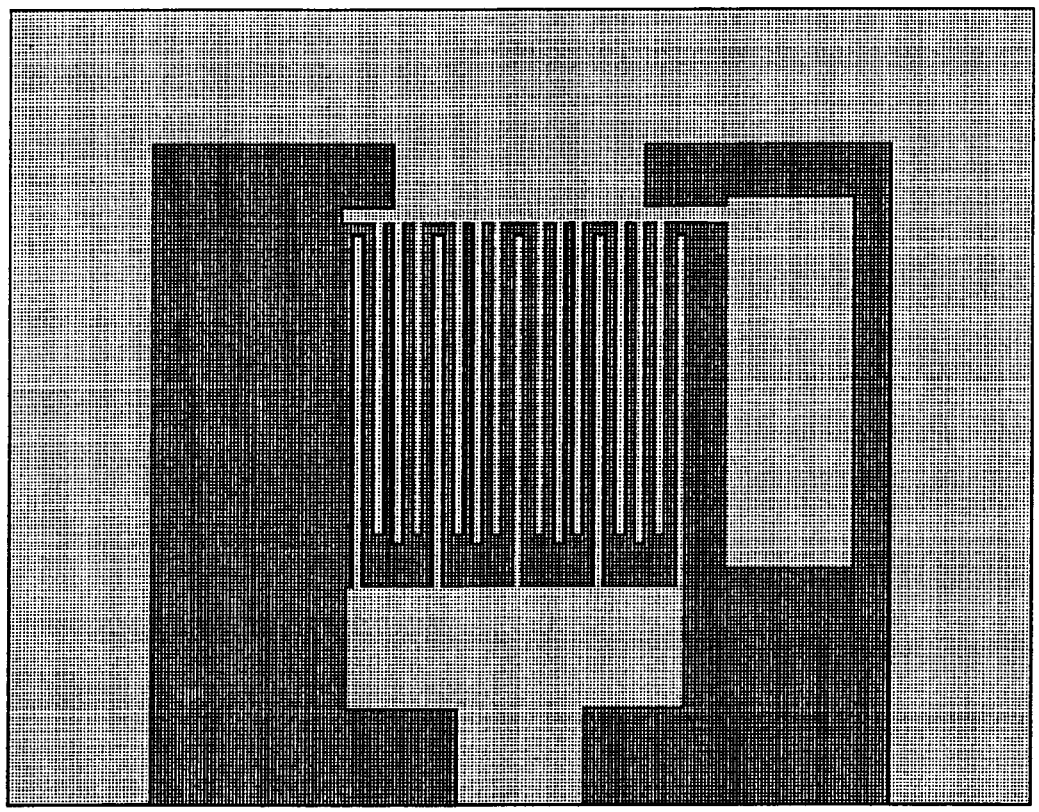
FIG. 8 shows present invention with high density of finger electrodes.
Figure 13:
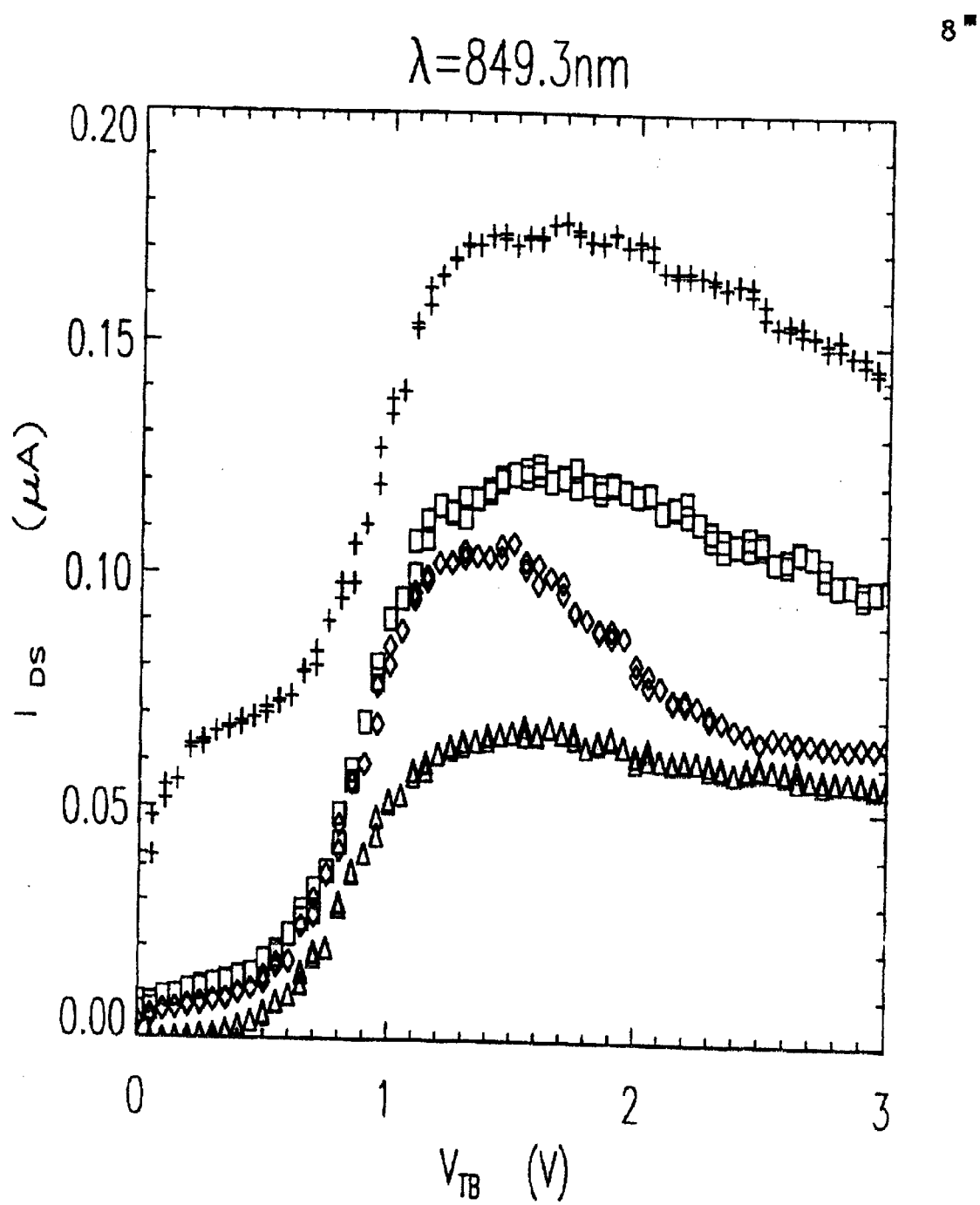
Figure 14:
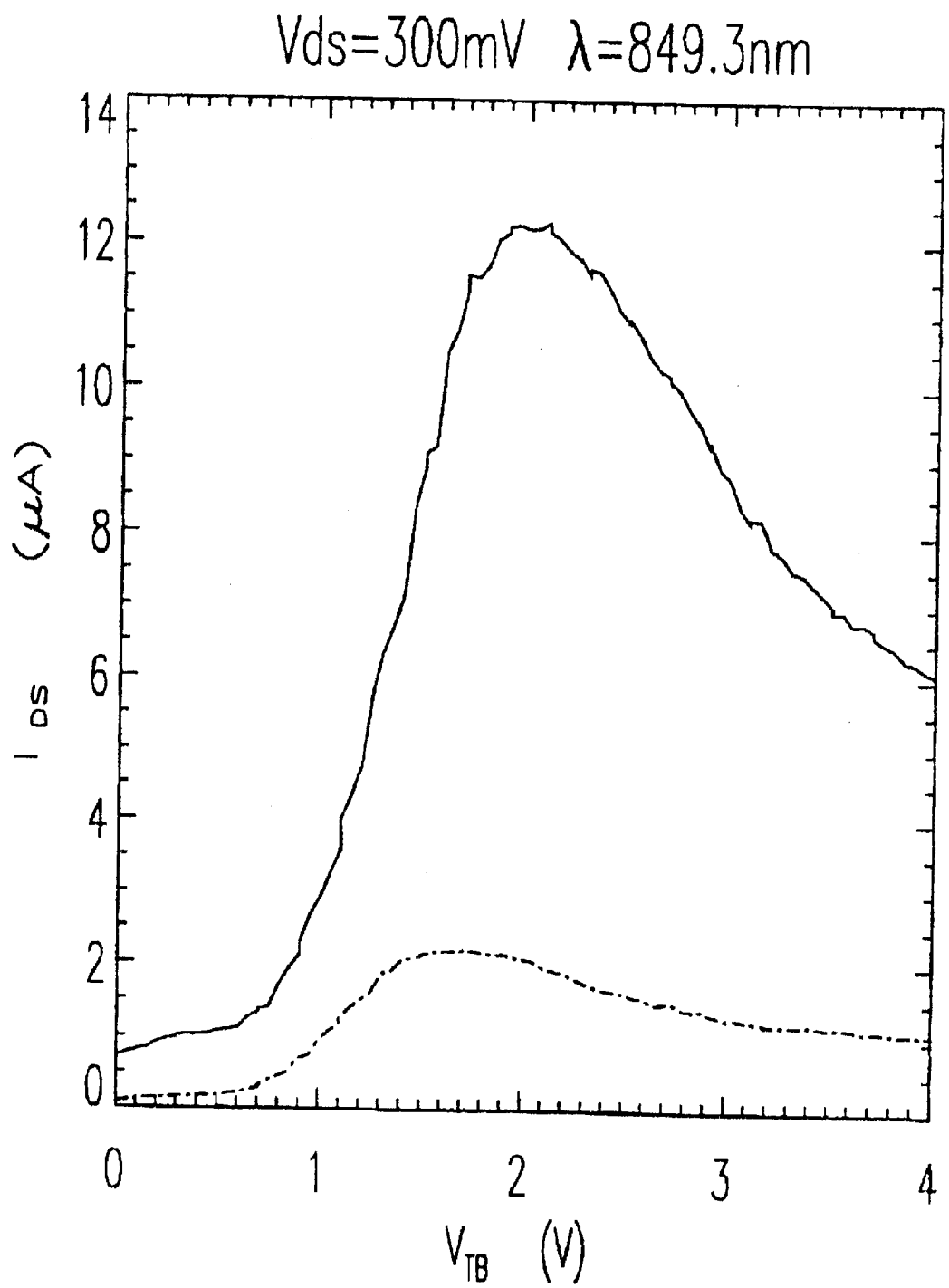

FIG. 13 is a plot of in-plane photocurrent (Ids) versus modulating field (Vtb) typical of the fabricated devices of FIGS. 7 and 8 with constant optical power and 0<Vds<1V;

FIG. 14 is a plot demonstrating extraction of in-plane photocurrent (Ids) versus modulating field (Vtb) with Vds=300 mV and varying optical monochromatic power;

DESCRIPTION OF PREFERRED EMBODIMENT

Figure 1:
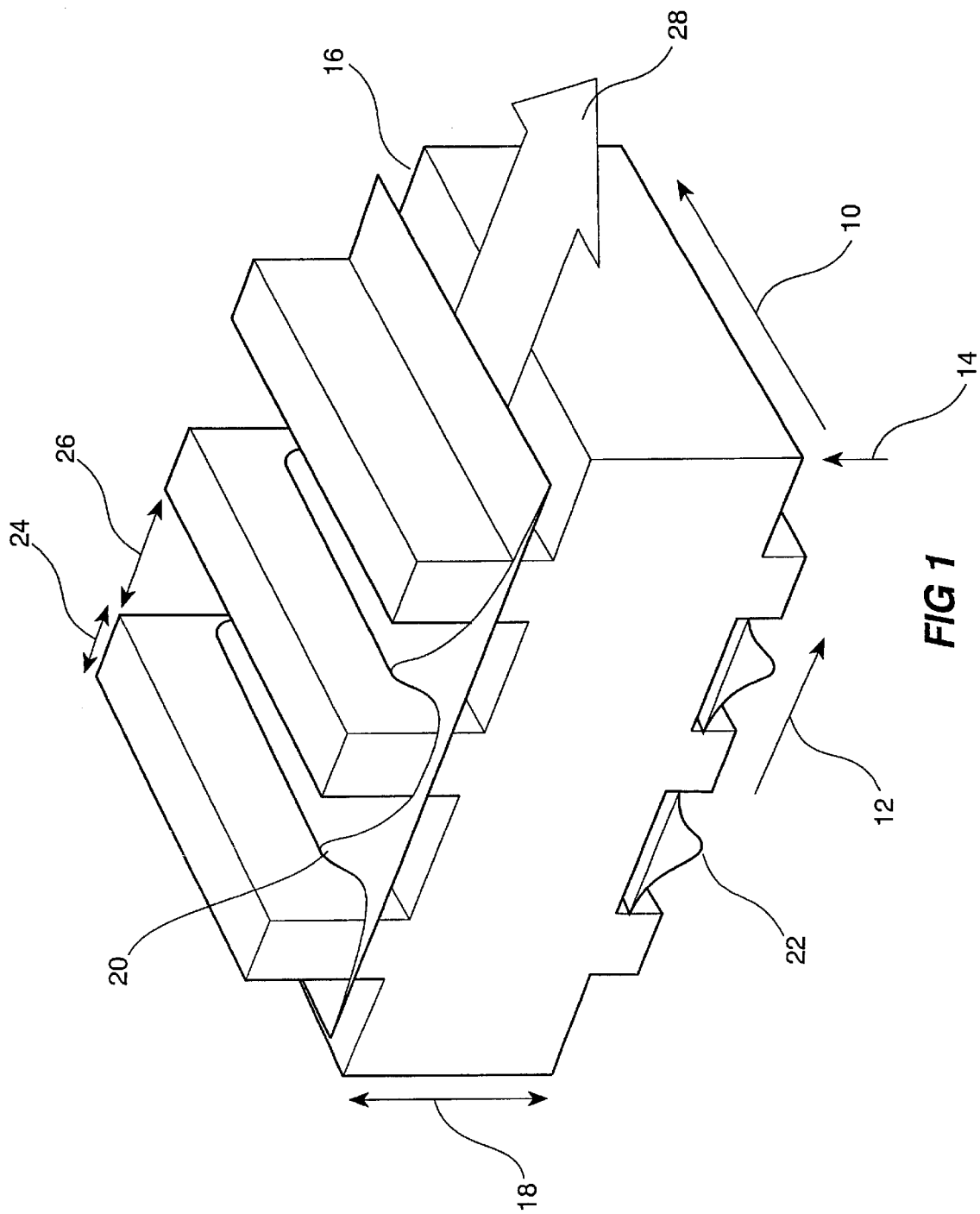
FIG. 1 is a schematic potential energy diagram as a function of growth direction of a multiple quantum well (MQW). Narrow band gap well layer semiconductor width 26, Wide band gap barrier layer width 24. Vertical axis represents potential energy 18, growth direction 12, in-plane real space co-ordinates 10. The lowest energy electron wavefunction 20, the lowest lying heavy-hole wavefunction 22. Vertical transport of electrons by tunneling through the quantum well barriers with electric field applied along the growth direction depicted as 28.

Referring now to the figures in detail there is shown in FIG. 1 typical carrier transportation that is perpendicular to multiple quantum well (MQW) layers via the tunneling process. Shown is a multiple quantum well structure extending in the spatial X-Y-plane 10 defining the in-plane vector, Z-plane 12 defining the growth axis, valence band edge 14, conduction band edge 16 and Egw depicting the direct energy gap between the conduction and valence band edges of the narrow band gap well layer 18. The coupled MQW electron spatial wavefunction probability is shown as 20 whilst the heavy-hole wavefunction is 22. Width of the wide band gap energy barrier layer along the growth direction Z is shown as 24 and the well layer width is 26. The perpendicular electron transport along the growth direction is shown as 28. Due to the electron effective mass being much smaller than the heavy-hole, the lowest energy electron wavefunction has finite probability in the barrier layer, whereas the heavy-hole is effectively confined solely to the well layer. Thus electron transport can take place via tunneling whereas the heavy-hole must be ejected from its potential well via a thermionic process.

Figure 2:
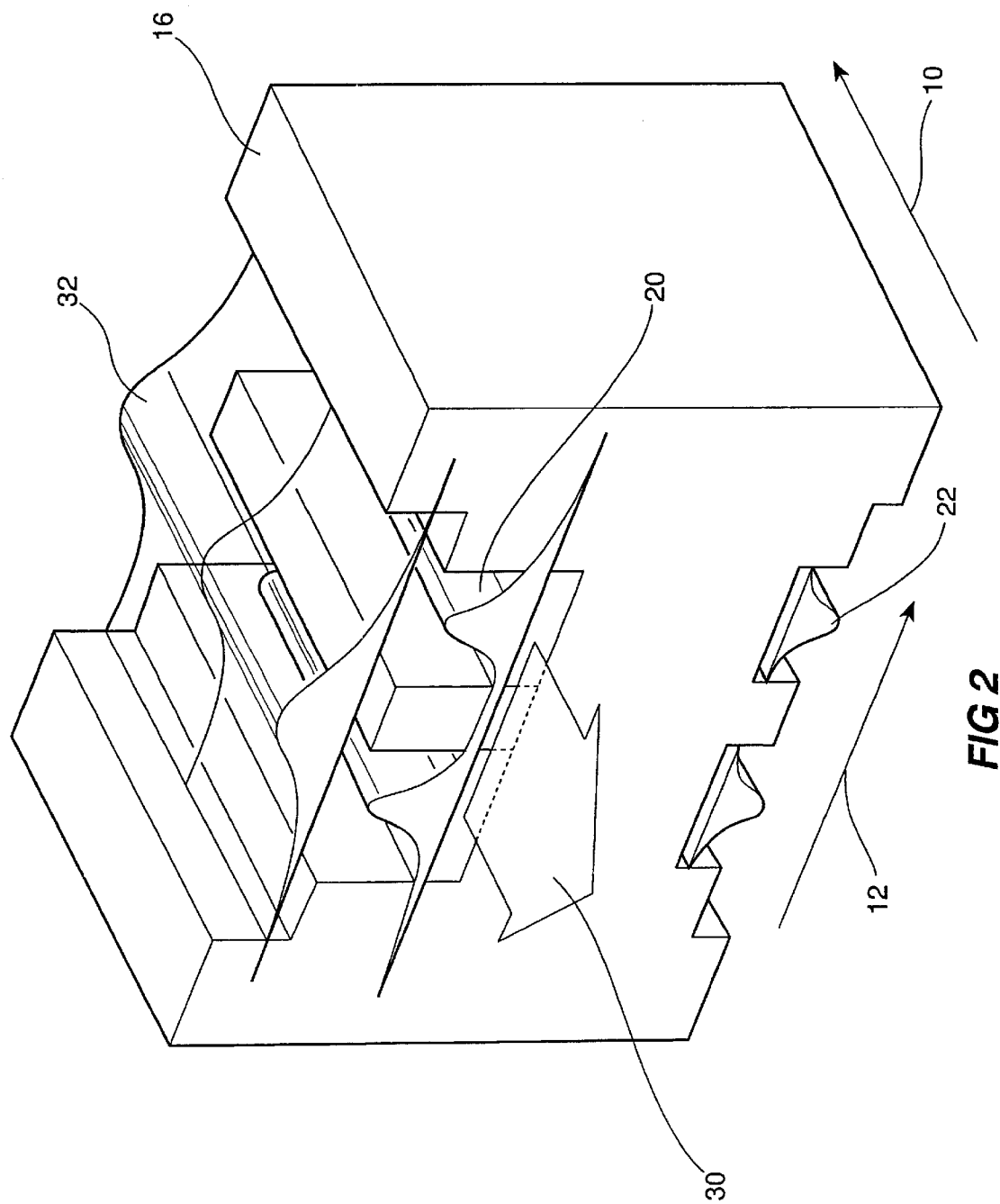
FIG. 2 is a schematic potential energy diagram as a function of growth direction of a MQW sandwiched between wide band gap blocking layers 16. In-plane electron transport with an applied electric field parallel to the plane of quantum wells 30. High energy above quantum well barrier electron wavefunction 32.

FIG. 2 exemplifies carrier transport parallel to the MQW layers. Under the influence of an electric field parallel to the plane of the layers one can induce an electron transport current along the X-Y plane 30 . The quasi-continuum is represented by 32 (including higher quantized states) and becomes populated by photogenerated carriers if they are not extracted within the exciton-phonon ionization time. The large potential energy 'blocking-layers' used to confine photogenerated electrons and holes solely within the plane of the active region and control the dark current is shown as 16. These blocking layers can be formed by a superlattice as described in FIG. 4. By using strained active layer material with enhanced heavy-hole effective mass one can also induce high mobility hole transport in an opposite direction to 30 solely within the plane of the active layers. This is a prime utility of the present invention.

Figure 3:
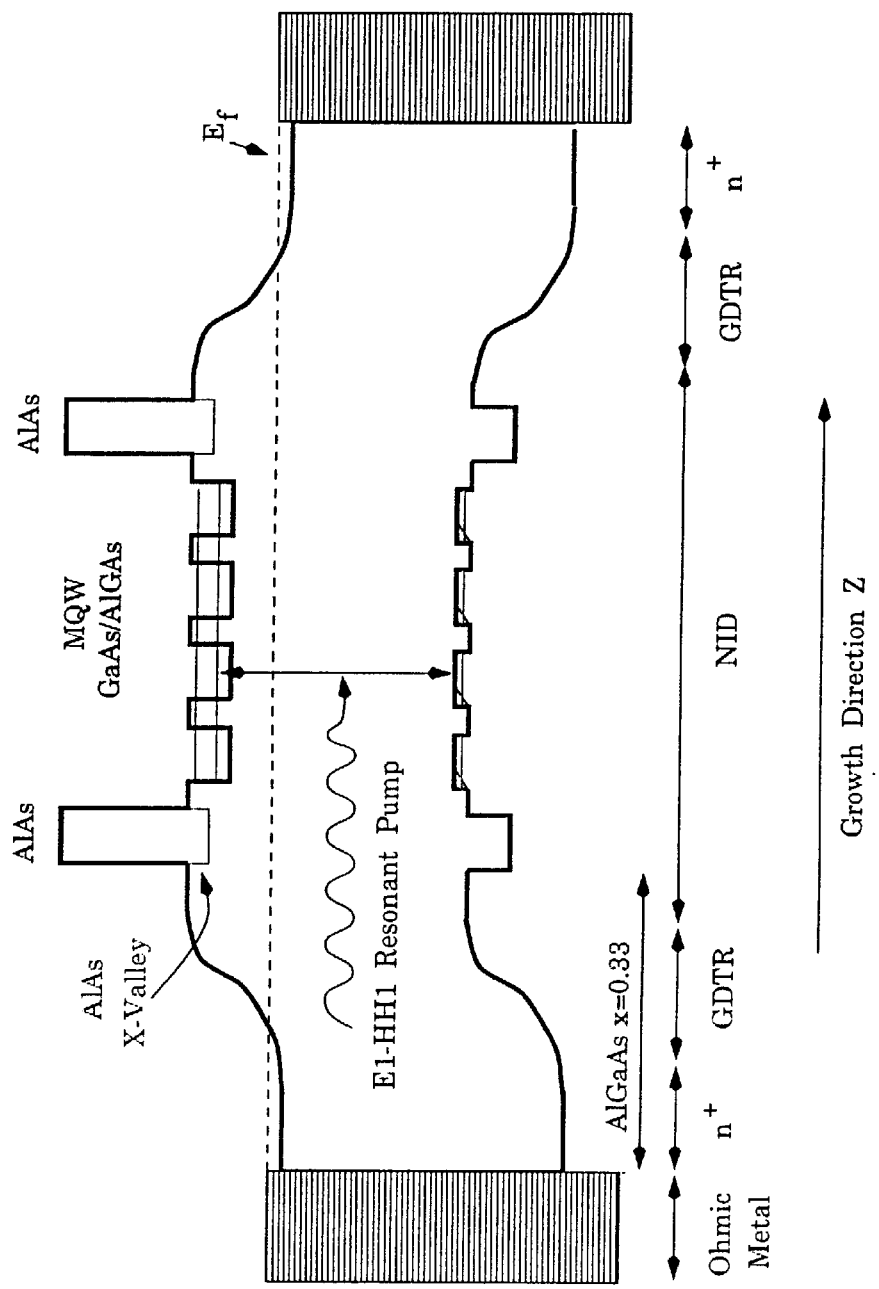
FIG. 3 is a potential energy diagram versus growth direction for the symmetric n-i(MQW)-n pseudomorphic structure.

FIG. 3 is a schematic diagram showing potential energy (k=0) versus growth direction of the symmetric n-i(MQW)-n structure. Shown is the central optically active multiple quantum well region sandwiched by wide band gap blocking layers used to control the dark current between the two n-doped contact layers. The MQW is composed of 15 periods of 100 Angstrom GaAs wells and 40 Angstrom Al_(0.3)Ga_(0.7)As barrier layers. The active region is clad by 200 Angstrom AlAs blocking layers along with 100 Angstrom NID Al_(0.3)Ga_(0.7)As spacer layer before and after the 10 period MQW. The doped layers are of sufficient band gap to render them transparent to the wavelengths of interest. The n-doped contact layers are designed so as to have a gradual variation of doping concentration over approximately 1000 Angstroms so that an inversion layer is not generated at the blocking-layer interface, labeled GDTR.

Figure 4:
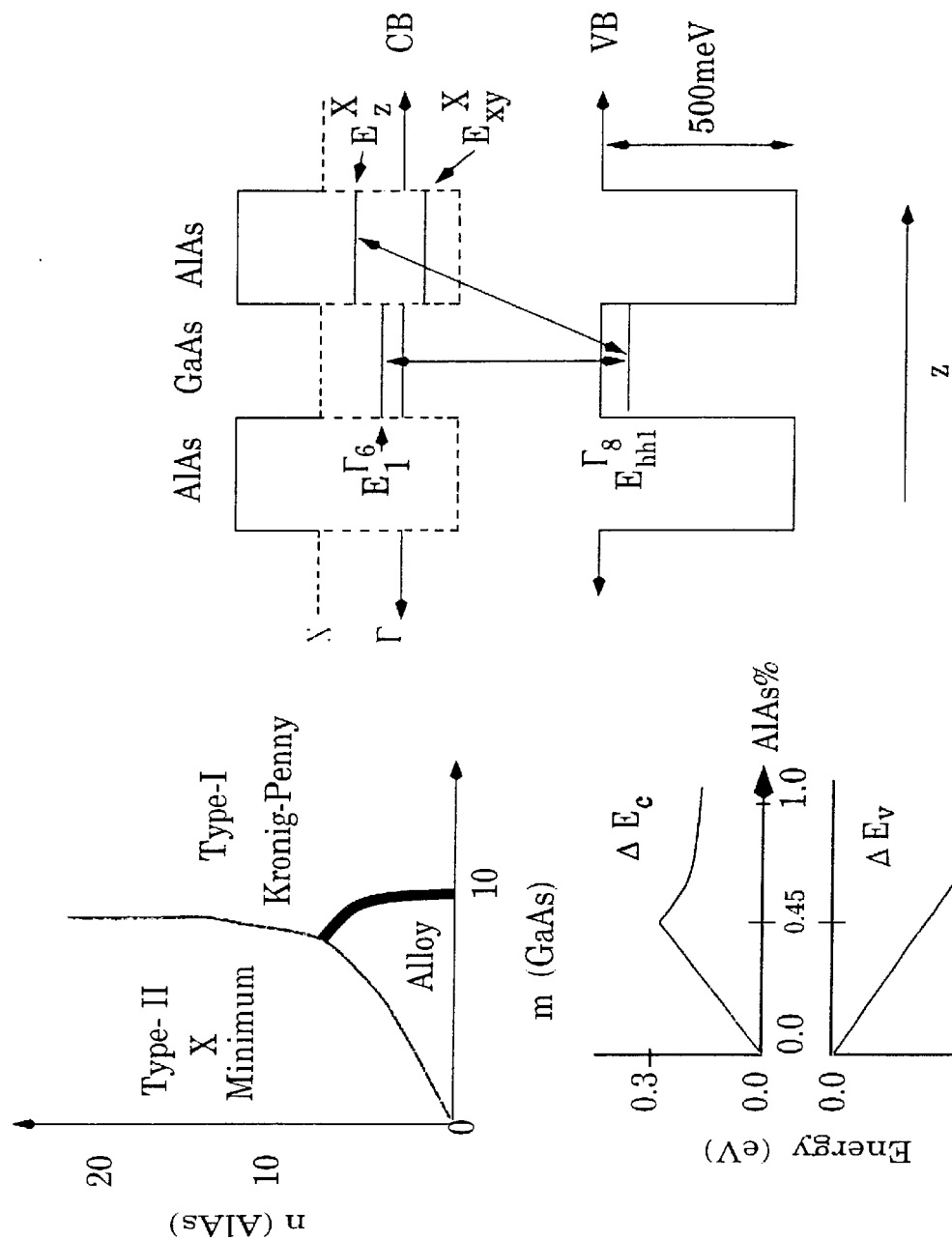
FIG. 4 are graphs showing the gamma-x-valley implications of using AlAs as a wide band gap dark current blocking-layer. For Aluminum concentration x>0.45 for the Al_(x)Ga_(1−x)As alloy the direct band gap is no longer the lowest energy gap and becomes indirect due to the reciprocal lattice energy position of the X-valley (right side diagram). This limits the maximum potential energy barrier that can be used as a blocking layer if bulk AlAs is used (lower left diagram). By growing a superlattice of 'm' monolayers of GaAs and 'n' monolayers of AlAs one can create a multiquantum barrier structure with an effective direct band gap in excess of that of pure AlAs (upper left diagram)

The difficulty in growing a suitable wide band gap blocking layer to inhibit vertical transport of carriers through the structure is depicted in FIG. 4 (lower left). The direct band gap of Al_(x)Ga_(1−x)As semiconductor is not the lowest optical transition for x>0.45. When AlAs (or x>0.45) is used as a blocking layer significant Gamma-X valley (i.e. symmetry points of the reciprocal lattice space) tunneling can occur effectively reducing the potential energy barrier for electrons, depicted by the band structure of the AlAs and GaAs hetero-interface of FIG. 4. A possible solution is by the use of a short period GaAs/AlAs superlattice. This allows one to overcome the limitation of the indirect bandgap of AlAs. Shown in FIG. 4 (upper right) is the change in character of the GaAs/AlAs superlattice depending upon the number of monolayers of GaAs (m) and monolayers of AlAs (n) . Choosing the correct thickness GaAs/AlAs digital alloy one can produce a Type-I superlattice with an effective barrier height unattainable with bulk material. This is can be readily modeled using a transfer matrix method.

Figure 5:
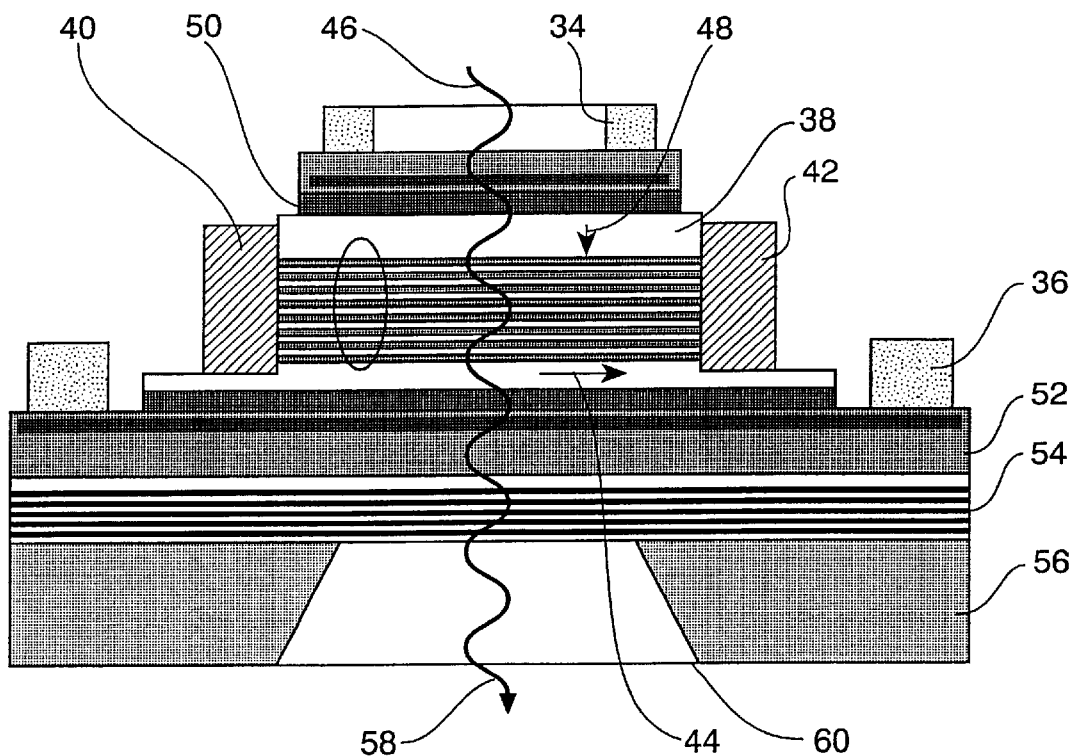
FIG. 5 is a schematic diagram showing the theory of operation of the present invention.

Turning now to FIG. 5, this is a schematic diagram of the operation of the present invention. The device consists of a top contact 34 and a collector contact 36. A voltage applied between the top and collector contacts produces an electric field that is essentially perpendicular to the plane of the multiple quantum well layers 48 and is parallel to the growth direction. When a simultaneous voltage is applied between the source 40 and drain 42 contacts, an electric field that is parallel to plane of the multiple quantum well layers is generated, the electric field represented by 44. The semi-insulating GaAs substrate 56 can be etched to form an optical via 60 using an etch stop layer so as to provide a means of optically out coupling the modulated beam 58. Conversely a reflection device can be made by using a Bragg reflector structure. A superlattice buffer layer 54 can be used as a pseudo-substrate for strain tuning the optically active multiple quantum well.

When optical radiation 46 is incident upon the device with energy resonant to the multiple quantum well exciton transitions, electrons and holes are simultaneously generated in the active region. The electron and hole are spatially separated by the fields and swept out solely within the plane of the quantum wells and collected at the source and drain contacts, respectively if the source is biased positive with respect to the drain. The polarity assigned to the drain and source contacts is however arbitrary.

An important feature of this device is that the n-doped epitaxial layers defining the top and collector layers (e.g. collector layer 52) are only used to generate the perpendicular electric field 48 necessary to modulate the exciton absorption via the quantum confined Stark effect.

A feature of the present invention is that the drain 42 and source 40 are electrically isolated from the top 34 and collector 36 contacts by the use of suitably designed potential energy blocking-layers (e.g. 50).

Conversely, both the photogenerated electrons AND holes are capable of being extracted from the active region, using the drain and source contacts, without affecting the voltage between the top and collector voltage.

Figure 6:
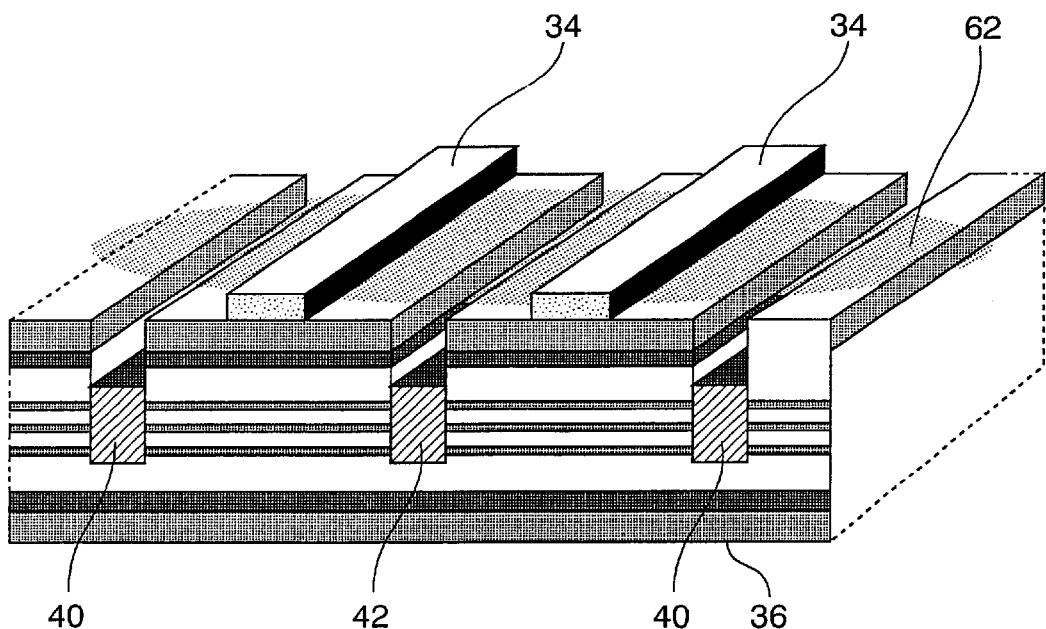
FIG. 6 is a schematic diagram of the present invention showing the high density packing of interleaved electrode configuration.

Turning now to FIG. 6, this shows a high density folded interleaved electrode configuration used to implement the top, collector, drain and source contacts while keeping the source-drain distance as small as possible. It is to be understood that the optical coupling efficiency into the multiple quantum well active region is determined by the ratio of optical window area to the electrical contact area. It is seen that the system consists of multiple top contacts 34, collector 36, sources 40 and drains 42. The focused light beam 62 impinges upon the device. It is important to note that the drain/source contacts are shown as recessed etched areas using a shallow ohmic process (so as not to electrically short out to the lower n-type collector layer), conventional HEMT ohmic alloying techniques to contact the channel could be used. Alternately, drain and source contacts to the MQW can be made via ion-implantation techniques allowing monolithic fabrication.

FIG. 7 shows the invention realized in two different configurations, the upper photo shows the top and collector electrodes optimized for high frequency operation (modulator). The collector is used as a ground plane and the top electrodes are connected to the signal pad of a typical high frequency ground-signal-ground probe pad configuration. The drain and source contact pads disposed as rectangular pads either side of the interdigitated electrodes. The lower photo shows the device configured as a receiver with the drain and source connected to the high frequency pads. FIG. 8 shows photo of the device with an optical window region approximately 100 microns square with a dense 'MSM-like' interdigitated finger arrangement and thus small source-to-drain lateral distance, in an attempt to reduce the transit time of laterally extracted photocarriers. The finger electrode widths are approximately 2 microns. The responsivity of the device can be scaled by keeping the finger spacing constant and increasing the number of source-top-drain periods. The devices shown in FIGS. 7 and 8 used air-bridge technology for overlapping conductors. By using Indium-Tin-Oxide as a transparent top metal contact one could increase the responsivity of the device further by allowing optical absorption beneath the top contact.

Figure 9:
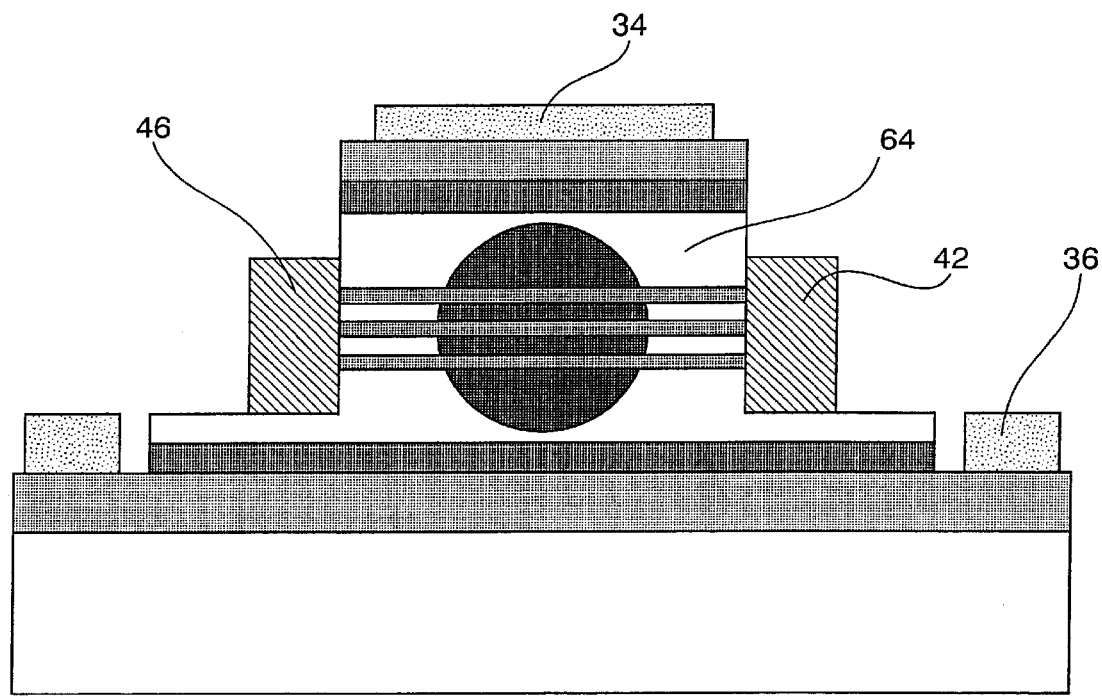
FIG. 9 shows a schematic diagram of a configuration of the present invention as an optical waveguiding modulator.

FIG. 9 shows an embodiment of the invention configured as an optical waveguide modulator including source 46, drain 42, top 34 and collector 36 contacts. The optically confined waveguide region 64 can be optimized by designing the electrical blocking layers and spacer layers surrounding the quantum wells so as to produce effective refractive index cladding layers to adequately confine the optical mode (shown as shaded circle) in the active region. Because vertical transport of carriers along the growth direction is avoided in the present invention a large degree of freedom is given to the optical design of the waveguide core and cladding regions. Therefore, gradient refractive index optical confinement can easily be incorporated into the design of the blocking layers by using chirped superlattices. The contacts to the plane of the layers defining the source and drain can either be recessed Ohmic contacts or implemented using ion-implantation dopant species. The difference in refractive index due to the implantation disorder (resulting in an effective blueshift of the bandgap) provides lateral optical mode confinement.

Figure 10:
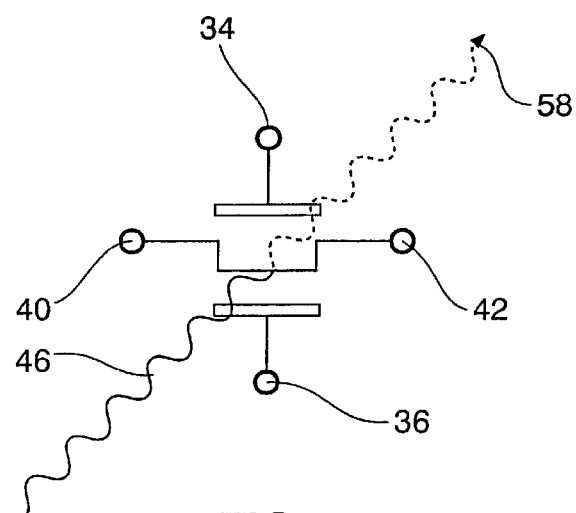
FIG. 10 is a schematic diagram showing the equivalent opto-electronic circuit of the invention, where absorption modulating contacts 34 and 36 are electrically isolated from photocarrier extraction contacts 40 and 42. Wavy line depicts optical input beam 46 and modulated optical output beam 58.

FIG. 10 is a schematic diagram showing the equivalent optoelectronic circuit of the invention, including top contact 34, collector 36, source 40, drain 42 input optical signal beam 46 and output optical signal beam 58. Note the diagram reflects the internal electrical isolation of the drain-source circuit and the top-collector circuit.

Figure 11:
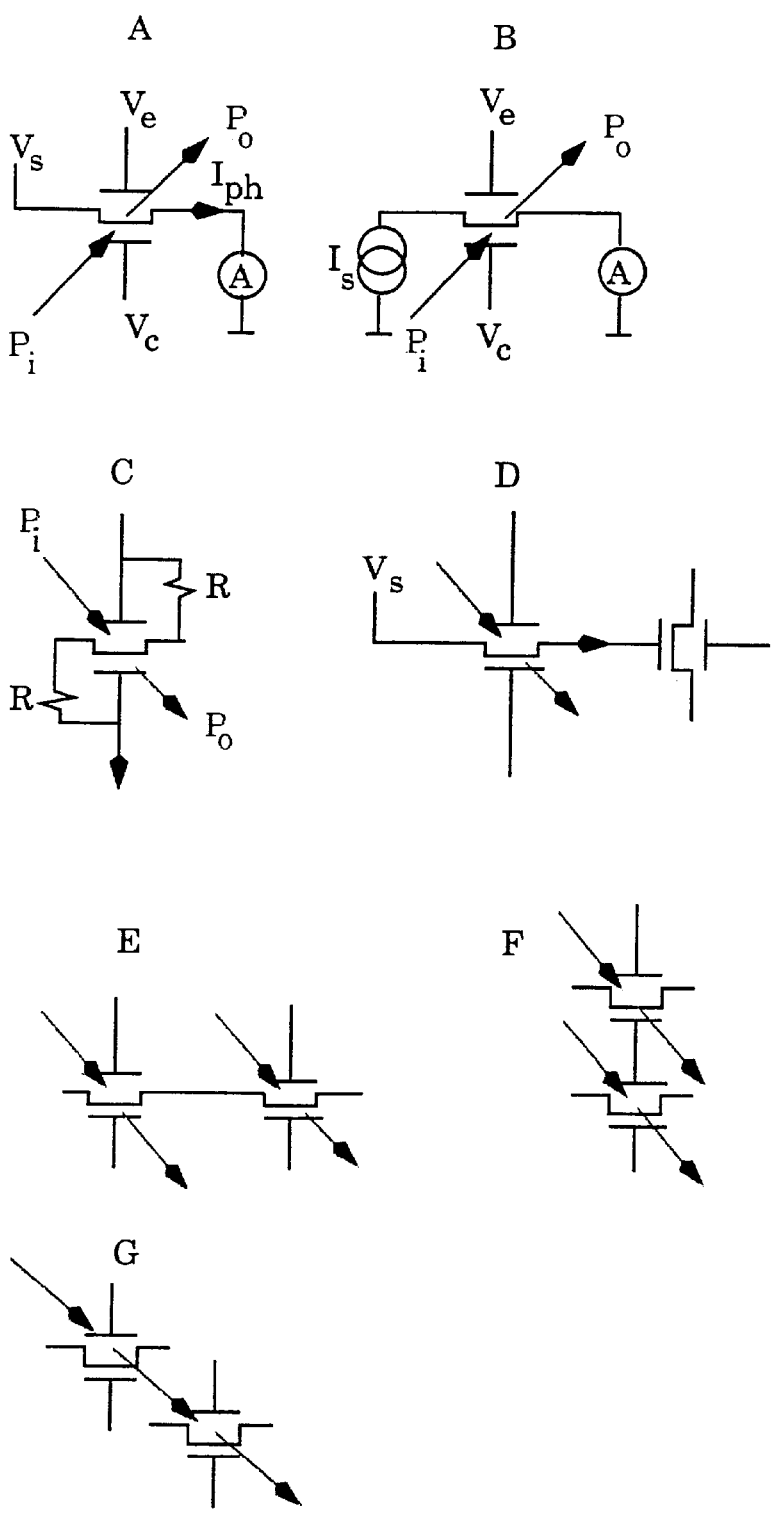
FIG. 11 circuit diagrams A–G are examples of optoelectronic implementations of the invention demonstrating how the photocurrent can be used independent to the modulating field.

FIG. 11 shows examples of the optoelectronic implementation of the present invention demonstrating the multifunction nature possible circuits. Not shown is the fact that the drain-source current can be externally amplified and then reconnected to the absorption modulating field thereby increasing the absorption sensitivity. The drain-source circuit can be connected to either a voltage or current source.

Figure 12:
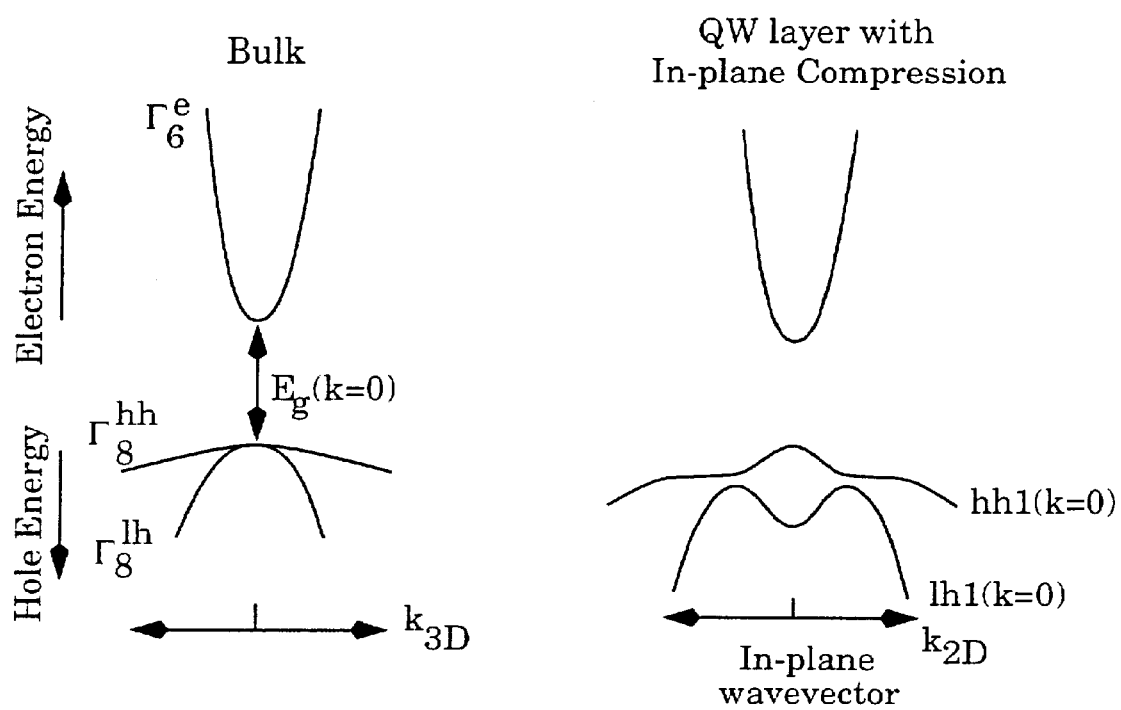
FIG. 12 left: diagram depicting the energy versus momentum dispersion of a Bulk direct band gap (Eg[k=0]) semiconductor. Vertical dimension depicts potential energy and horizontal dimension is three dimensional wave-vector.

FIG. 12 illustrates the electron and hole energy-momentum dispersion curves of typical bulk direct band gap material (left) and quantum well material with in-plane compression. Note the bulk curves are a function of three dimensional wave-vector and that of the strained QW are a function of the in-plane two-dimensional momentum. The QW curve labeled hh1(k=0) depicts the behaviour of the lowest energy heavy-hole, which for a range of wave-vectors lying mostly in the plane of the layers has light-hole characteristics. The quantum well conduction and valence band heterojunction offsets and thickness of the well and barrier regions determine quantization of the energy levels and splits the degeneracy at zone center k=0 seen in bulk cubic semiconductors. When strained layer materials are used, appropriately designed compressive and tensile strains can greatly warp the energy dispersion of the valence band. Depending upon the use of type-I or type-II QWs one can tune the strain of each layer by pseudomorphic growth on an appropriate buffer layer, and increase the energy separation between the lowest lying valence band states at k=0.

As the curvature of the energy-momentum curves are inversely proportional to the effective mass of the carrier, one can see that the heavy-hole effective mass can be considerably enhanced for a range of in-plane wave-vectors (k2D) mostly parallel to the plane of the quantum well. It is this fact that is used to enhance the hole mobility in the present invention which provides a means to extract the photogenerated electrons and holes efficiently.

FIG. 13 shows typical performance curves of the fabricated devices of FIGS. 7 and 8. Shown is the photocurrent extracted from the plane of the MQW layers (Ids) as a function of the absorption modulating electric field applied parallel to the growth direction (Vtb). The curves of FIG. 13 show the behaviour of the device for fixed incident photon energy, constant optical power and Vds varying from 0<Vds<1V. The photon energy is chosen to be of slightly lower energy than the zero QCSE field (i.e.: Vtb=0) heavy-hole exciton transition energy. As Vtb increases, the exciton energy redshifts due to the QCSE and a peak is seen in the Ids–Vtb transfer characteristic. Negligible current is measured between the top and collector contacts. The magnitude of Ids is seen to depend strongly on the electric field applied parallel to the plane of the layers. FIG. 14 shows the Ids–Vtb transfer characteristics for fixed Vds=300 mV and fixed incident photon energy. The two curves show that as the incident optical power is increased more photogenerated carriers are created and consequently extracted from the plane of the layers.

It is noted by the inventor that the above invention could be adapted to the generation of light with the in-plane contacts used to inject current carriers by the means of n-type species and p-type ion species defining regions for the source and drain via ion-implantation techniques. The QCSE can then be used to tune the emission photon energy.

The present invention is thus seen as an improvement for electronic and optoelectronic devices for the use as novel modulators and photodetectors.

What is claimed is:

1. An electrical four-port and optical two-port device including;
    a structure having an unstrained or strained semiconductor quantum well region comprising the active region;
    a means for the simultaneous application of non-parallel fields to the said quantum well structure;
    a means for providing photogenerated electron and hole blocking-layers disposed either side of the said active region as a means to confine both electron and hole carrier transport solely within a vector mostly parallel to the plane of the quantum well layers, thereby inhibiting transport of carriers along the growth direction of the quantum well;
    a means for generating an electric field mostly perpendicular to the layers of the quantum well structure using a single dopant species (namely n-type);
    a means for providing electrical contact to and being capable of generating an electric field mostly parallel to the plane of the layers of the active region;
    a means of coupling input optical power from an optical source into the said active region;
    a means of coupling out the modulated optical power from the said active region; and
    a means for modulating the active region absorption using the quantum confined Stark effect.

2. A device as in claim 1 wherein the optical power is directed perpendicular to the plane of the active region layers;
    a means for implementing a dense finger electrode arrangement for the electrically distinct four-port device, namely the top, drain, source and collector contacts;
    the collector used as a ground plane, the source and drain lateral spacing and finger widths minimized using an interdigitated arrangement, and the top finger aligned central to and with top electrode finger width less than the drain-source region; and
    a means of coupling optical power through the substrate and layers not comprising the active region.

3. A device as in claim 1 wherein the optical power is directed parallel to the plane of the active region layers; and
    a means for guiding the optical mode along a direction perpendicular to the drain and source contacts so as to form an optical waveguide.

4. A device as in claim 1 where the active region contains a Type-I strained superlattice where photogenerated electrons and holes are both confined in the smaller band gap layer wherein the optically absorbent well layer comprising the superlattice is in compression and the optically nonabsorbent barrier layer is in a state of tension.

5. An electrical four-port and optical two-port device including;
    a structure having a semiconductor quantum well region comprising the active region;
    a means for the simultaneous application of non-parallel fields to the said quantum well region;
    a means for providing photogenerated electron and hole blocking-layers disposed either side of the said active region as a means to confine both electron and hole carrier transport solely within a vector mostly parallel to the plane of the quantum well layers, thereby inhibiting transport of carriers along the growth direction of the quantum well;
    a means for generating an electric field mostly perpendicular to the layers of the quantum well structure using a single dopant species (namely n-type);
    a means for providing electrical contact to and being capable of generating an electric field mostly parallel to the plane of the layers of the active region;
    a means of coupling input optical power from an optical source into the said active region;
    a means of coupling out the modulated optical power from the said active region; and
    a means for modulating the active region absorption using the quantum confined Stark effect.

6. A device as in claim 5 wherein the optical power is directed perpendicular to the plane of the active region layers.

7. A device as in claim 5 wherein there is a further included a means for implementing a dense finger electrode arrangement for the electrically distinct four-port device, namely the top, drain, source and collector contacts.

8. A device as in claim 7 wherein said collector is used as a ground plane, the source and drain lateral spacing and finger widths are minimized using an interdigitated arrangement, and the top finger aligned central to and with top electrode finger width less than the drain-source region.

9. A device as in claim 5 wherein the optical power is directed parallel to the plane of the active region layers.

10. A device as in claim 5 wherein there are further means for guiding the optical mode along a direction perpendicular to the drain and source contacts so as to form an optical waveguide.

11. A device as in claim 5 where the active region contains a Type-I strained superlattice.

12. A device as in claim 5 where photogenerated electrons and holes are both
    confined in the smaller band gap layer wherein the optically absorbent well layer comprising the superlattice is in compression and the optically nonabsorbent barrier layer is in a state of tension.

13. The device as in claim 5 where there are further means of coupling optical power through the substrate and layers not comprising the active region.

* * * * *